US012707636B2

(12) United States Patent
Bin et al.

(10) Patent No.: US 12,707,636 B2
(45) Date of Patent: Aug. 11, 2026

(54) METHOD FOR FABRICATING SEMICONDUCTOR MEMORY DEVICE WITH SOURCE COUPLING STRUCTURE

(71) Applicant: SK hynix Inc., Icheon-si (KR)

(72) Inventors: Jin Ho Bin, Icheon-si (KR); Chul Young Kim, Icheon-si (KR); Ji Yeon Baek, Icheon-si (KR); Sul Gi Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 954 days.

(21) Appl. No.: 17/954,164

(22) Filed: Sep. 27, 2022

(65) Prior Publication Data

US 2023/0320095 A1 Oct. 5, 2023

(30) Foreign Application Priority Data

Mar. 31, 2022 (KR) ........................ 10-2022-0040002

(51) Int. Cl.
*H10B 43/27* (2023.01)
*H01L 23/528* (2006.01)
*H10B 41/10* (2023.01)

(52) U.S. Cl.
CPC .................................... *H10B 43/27* (2023.02)

(58) Field of Classification Search
CPC ........ H10B 43/27; H10B 43/30; H10B 43/40; H10B 43/50; H10B 41/27; H10B 41/35; H10B 43/35; H10B 43/10; H10B 41/10; H10B 43/20; H10B 41/50; H10B 51/20; H10B 51/30; H10B 41/30; H10B 41/40; H10B 41/20; H10B 51/10; H10B 41/41; H10B 43/00; H10B 99/00; H10B 80/00; H10B 20/50; H10B 41/23; H10B 41/42; H10B 69/00; H10B 12/01; H10B 12/20; H10P 50/71; G11C 16/14; G11C 16/28
See application file for complete search history.

(56) References Cited

U.S. PATENT DOCUMENTS 10,163,924 B2 * 12/2018 Ahn ........................ H10B 41/27
2016/0071881 A1 * 3/2016 Lee ........................ H10D 62/83 257/329
2016/0079267 A1 * 3/2016 Fukuzumi .............. H10B 41/27 438/269

(Continued)

FOREIGN PATENT DOCUMENTS

KR 1020170106051 A 9/2017
KR 1020210015343 A 2/2021

*Primary Examiner* — Leonard Chang
*Assistant Examiner* — Tsz K Chiu
(74) *Attorney, Agent, or Firm* — WILLIAM PARK AND ASSOCIATES LTD.

(57) ABSTRACT

A method of manufacturing a semiconductor memory device includes forming a preliminary source structure including a source sacrificial layer, forming a preliminary stacked structure including insulating layers and first sacrificial layers over the preliminary source structure, forming a slit passing through the preliminary stacked structure, removing the first sacrificial layers through the slit to define first recess regions between the insulating layers, forming a second sacrificial layer in each of the first recess regions, removing the source sacrificial layer through the slit to define a second recess region, and forming a source channel coupling layer in the second recess region.

14 Claims, 15 Drawing Sheets

(56) References Cited

U.S. PATENT DOCUMENTS

2016/0181264 A1* 6/2016 Miyamoto ........ H01L 21/28568
257/314
2017/0162591 A1* 6/2017 Choi ...................... H10B 41/27
2018/0175053 A1* 6/2018 Park ....................... H10B 43/27
2019/0355734 A1* 11/2019 Choi ...................... H10B 41/27

* cited by examiner

METHOD FOR FABRICATING SEMICONDUCTOR MEMORY DEVICE WITH SOURCE COUPLING STRUCTURE

CROSS-REFERENCE TO RELATED APPLICATION

The present application claims priority under 35 U.S.C. § 119(a) to Korean patent application number 10-2022-0040002, filed on Mar. 31, 2022, in the Korean Intellectual Property Office, the entire disclosure of which is incorporated herein by reference.

BACKGROUND

1. Technical Field

Various embodiments of the present disclosure generally relate to a method of manufacturing a semiconductor memory device, and more particularly, to a method of manufacturing a three-dimensional semiconductor memory device.

2. Related Art

Non-volatile memory devices retain stored data even in the absence of supplied power. Due to the limitations in increasing the integration density of two-dimensional non-volatile memory devices in which memory cells are formed in a single layer over a substrate, three-dimensional non-volatile memory devices have been proposed in which memory cells are stacked in a vertical direction over a substrate.

A three-dimensional non-volatile memory device may include insulating layers and gate electrodes alternately stacked on each other and channel layers passing through the insulating layers and the gate electrodes, and memory cells may be stacked along the channel layers. Various structures and manufacturing methods have been developed to improve the operational reliability of the three-dimensional non-volatile memory device having the above-described configuration.

SUMMARY

According to an embodiment of the present disclosure, a method of manufacturing a semiconductor memory device may include forming a preliminary source structure including a source sacrificial layer, forming a preliminary stacked structure including insulating layers and first sacrificial layers over the preliminary source structure, forming a slit passing through the preliminary stacked structure, removing the first sacrificial layers through the slit to define first recess regions between the insulating layers, forming a second sacrificial layer in each of the first recess regions, removing the source sacrificial layer through the slit to define a second recess region, and forming a source channel coupling layer in the second recess region.

DETAILED DESCRIPTION

Specific structural or functional descriptions disclosed herein are merely illustrative for the purpose of describing embodiments according to the concept of the present disclosure. Embodiments according to the concept of the present disclosure should not be construed as being limited to the specific embodiments set forth herein, but may be implemented in various forms.

In embodiments of the present disclosure, the terms such as "first" and "second" may be used to describe various components. However, the components should not be limited by these terms. The above terms are used to distinguish one component from another component. For example, a first component may be referred to as a second component without departing from the scope in accordance with the concept of the present disclosure and similarly, a second component may be referred to as a first component. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers present.

Various embodiments are directed to a method of manufacturing a semiconductor memory device with easy manufacturing processes, a stabilized structure, and improved characteristics.

Figure 1:
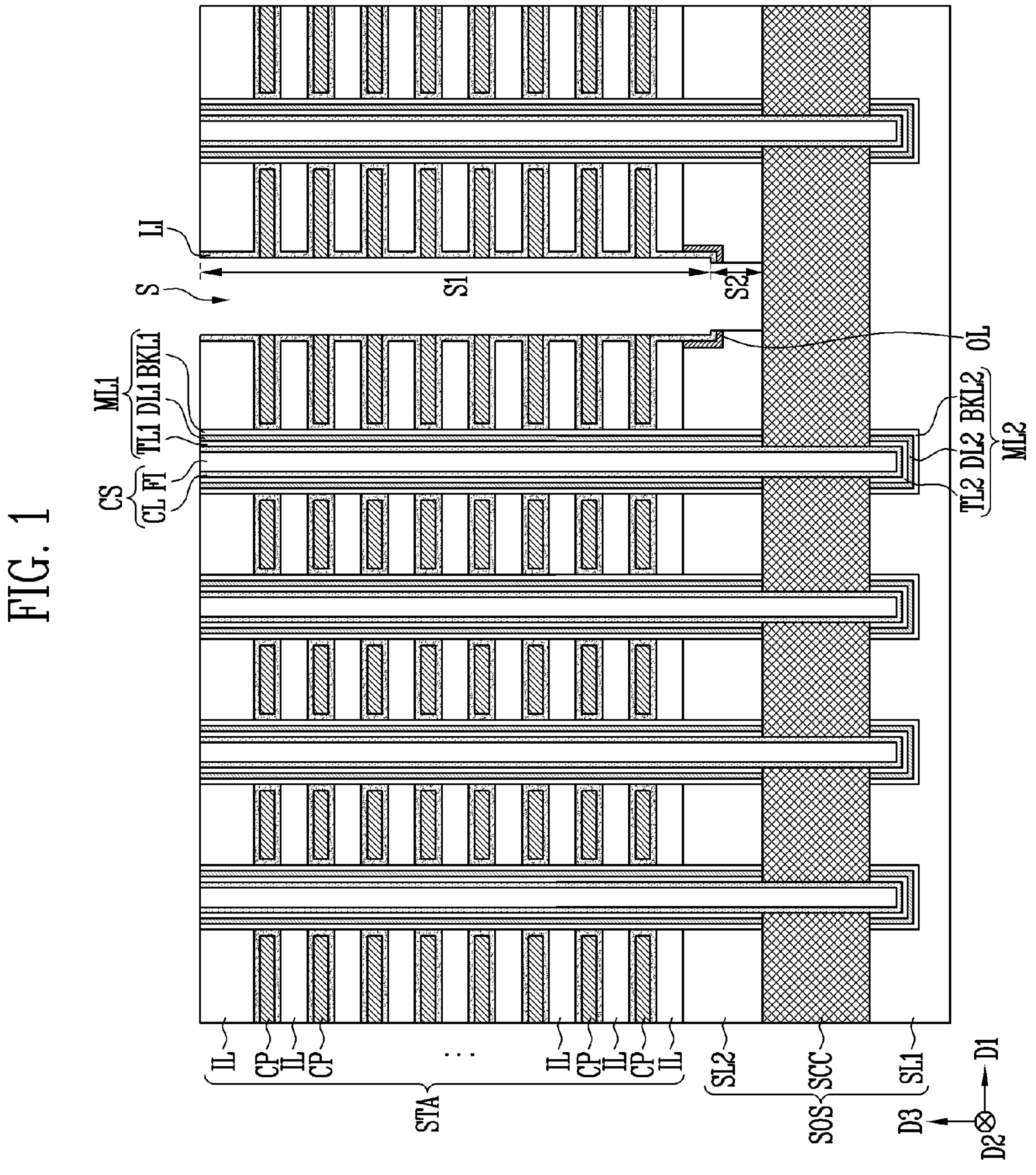
FIG. 1 is a cross-sectional diagram illustrating a structure of a semiconductor memory device according to an embodiment.

FIG. 1 is a cross-sectional diagram illustrating a structure of a semiconductor memory device according to an embodiment.

Referring to FIG. 1, the semiconductor memory device according to the embodiment may include a source structure SOS. The source structure SOS may have a plate shape extending along a plane defined by a first direction D1 and a second direction D2. The first direction D1 and the second direction D2 may cross each other. For example, the first direction D1 and the second direction D2 may cross at right angles.

According to an embodiment, the source structure SOS may be disposed on a substrate that physically supports the source structure SOS. For example, the substrate may be a semiconductor substrate or an insulating substrate.

According to an embodiment, a peripheral circuit structure including transistors and lines may be disposed between the source structure SOS and the substrate.

The source structure SOS may include a first source layer SL1, a source channel coupling layer SCC, and a second source layer SL2. The first source layer SL1, the source channel coupling layer SCC, and the second source layer SL2 may be sequentially stacked on each other in a third direction D3. The third direction D3 may cross the first direction D1 and the second direction D2. For example, the third direction D3 may cross the first direction D1 and the second direction D2 at right angles.

The first source layer SL1, the source channel coupling layer SCC, and the second source layer SL2 may include the same material. The first source layer SL1, the source channel coupling layer SCC, and the second source layer SL2 may include a semiconductor material. According to an embodiment, the first source layer SL1, the source channel coupling layer SCC, and the second source layer SL2 may include doped polysilicon. The source structure SOS may be coupled to channel structures CS through the source channel coupling layer SCC.

A stacked structure STA may be disposed over the source structure SOS. The stacked structure STA may include insulating layers IL and conductive layers CP alternately stacked on each other in the third direction D3.

The insulating layers IL may include an insulating material. According to an embodiment, the insulating layers IL may include an oxide. The conductive layers CP may include at least one of a doped silicon layer, a metal silicide layer, tungsten, nickel, and cobalt. The conductive layers CP may serve as word lines coupled to a memory cell or select lines coupled to a select transistor.

The channel structures CS may pass through the stacked structure STA, the second source layer SL2, the source channel coupling layer SCC, and the first source layer SL1. The channel structures CS may pass through the insulating layers IL and the conductive layers CP of the stacked structure STA. The channel structures CS may extend in the third direction D3. The lowermost part of each of the channel structures CS may be disposed in the first source layer SL1. The channel structures CS may be electrically coupled to the source channel coupling layer SCC of the source structure SOS.

Each of the channel structures CS may include a filling layer FI and a channel layer CL that surrounds the filling layer FI. The filling layer FI and the channel layer CL may pass through the stacked structure STA, the second source layer SL2, the source channel coupling layer SCC, and the first source layer SL1. The filling layer FI and the channel layer CL may extend in the third direction D3. The channel layer CL may contact the source channel coupling layer SCC. The channel layer CL may be electrically coupled to the source channel coupling layer SCC of the source structure SOS.

The filling layer FI may include an insulating material. According to an embodiment, the filling layer FI may include an oxide. The channel layer CL may include a semiconductor material. According to an embodiment, the channel layer CL may include polysilicon.

A first memory layer ML1 and a second memory layer ML2 that surround each of the channel structures CS may be included in the semiconductor memory device according to the embodiment. The first memory layer ML1 may surround an upper part and an intermediate part of each of the channel structures CS. The second memory layer ML2 may surround a lower part of each of the channel structures CS. The first memory layer ML1 may pass through the stacked structure STA and the second source layer SL2. The second memory layer ML2 may be disposed in the first source layer SL1.

The first and second memory layers ML1 and ML2 may be spaced apart from each other in the third direction D3. A part of the source channel coupling layer SCC may be provided between the first memory layer ML1 and the second memory layer ML2. The part of the source channel coupling layer SCC that is provided between the first memory layer ML1 and the second memory layer ML2 may contact the channel layer CL. The first memory layer ML1 and the second memory layer ML2 may be spaced apart from each other by the source channel coupling layer SCC.

The first memory layer ML1 may include a first tunnel insulating layer TL1 that surrounds an upper part and an intermediate part of the channel layer CL, a first data storage layer DL1 that surrounds the first tunnel insulating layer TL1, and a first blocking layer BKL1 that surrounds the first data storage layer DL1. The second memory layer ML2 may include a second tunnel insulating layer TL2 that surrounds a lower part of the channel layer CL, a second data storage layer DL2 that surrounds the second tunnel insulating layer TL2, and a second blocking layer BKL2 that surrounds the second data storage layer DL2.

The first and second tunnel insulating layers TL1 and TL2 may be spaced apart from each other in the third direction D3. A part of the source channel coupling layer SCC may be provided between the first tunnel insulating layer TL1 and the second tunnel insulating layer TL2. The first and second data storage layers DL1 and DL2 may be spaced apart from each other in the third direction D3. Another part of the source channel coupling layer SCC may be provided between the first data storage layer DL1 and the second data storage layer DL2. The first and second blocking layers BKL1 and BKL2 may be spaced apart from each other in the third direction D3. Another part of the source channel coupling layer SCC may be provided between the first blocking layer BKL1 and the second blocking layer BKL2.

The first and second tunnel insulating layers TL1 and TL2 may include a material allowing charge tunneling. According to an embodiment, the first and second tunnel insulating layers TL1 and TL2 may include an oxide. According to an embodiment, the first and second data storage layers DL1 and DL2 may include a nitride in which charges may be trapped. However, a material included in the first and second data storage layers DL1 and DL2 is not limited to a nitride and may vary according to a data storage method. According to an embodiment, the first and second data storage layers DL1 and DL2 may include silicon, a phase-change material, or nanodots. The first and second blocking layers BKL1 and BKL2 may include a material capable of blocking movement of charges. According to an embodiment, the first and second blocking layers BKL1 and BKL2 may include an oxide.

A slit S passing through the stacked structure STA, the second source layer SL2, and the source channel coupling layer SCC may be disposed. The slit S may extend in the second direction D2 and the third direction D3. The slit S may extend in the third direction D3 and pass through the stacked structure STA, the second source layer SL2, and the source channel coupling layer SCC. The slit S may include a first part S1 that passes through the stacked structure STA and extends into the second source layer SL2 and a second part S2 that extends towards the source channel coupling layer SCC from the first part S1. The second part S2 of the slit S may pass through a lower part of the second source layer SL2 and have a width that is smaller than that of the first part S1 of the slit S.

A liner layer LI may be disposed between the insulating layers IL and the conductive layers CP. The liner layer LI may extend along sidewalls of the insulating layers IL that face the slit S and sidewalls of the conductive layers CP that face the channel structures CS. The liner layer LI may extend along a part of the first part S1 of the slit S that is disposed in the second source layer SL2 and have a point of inflection on the second source layer SL2. The liner layer LI may be penetrated by the second part S2 of the slit S.

An oxide layer OL may be disposed between the second source layer SL2 and the liner layer LI. The oxide layer OL may extend in the second direction D2.

Although not illustrated in FIG. 1, an insulating material may be formed in the slit S or a conductive source contact structure that is coupled to the source channel coupling layer SCC may be disposed in the slit S.

FIGS. 2A to 2L are cross-sectional diagrams illustrating a method of manufacturing a semiconductor memory device according to an embodiment.

Figure 2A:
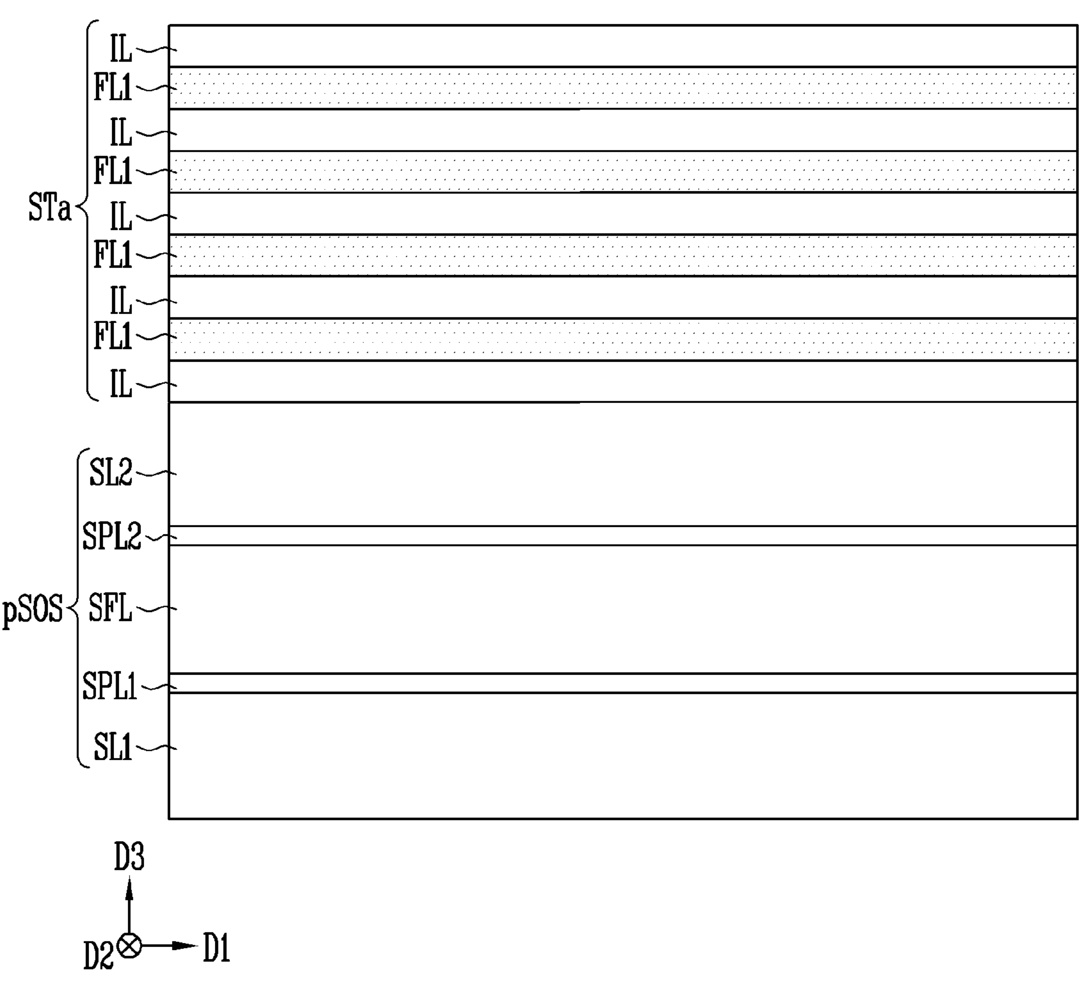
FIGS. 2A, 2B, 2C, 2D, 2E, 2F, 2G, 2H, 2I, 2J, 2K, and 2L are cross-sectional diagrams illustrating a method of manufacturing a semiconductor memory device according to an embodiment.

Referring to FIG. 2A, a preliminary source structure pSOS may be formed. The preliminary source structure pSOS may include the first source layer SL1, a first source protective layer SPL1, a source sacrificial layer SFL, a second source protective layer SPL2, and the second source layer SL2 that are sequentially stacked in the third direction D3. The preliminary source structure pSOS may be formed by sequentially forming the first source layer SL1, the first source protective layer SPL1, the source sacrificial layer SFL, the second source protective layer SPL2, and the second source layer SL2. The first and second source protective layers SPL1 and SPL2 may be disposed between the first source layer SL1 and the second source layer SL2. The source sacrificial layer SFL may be disposed between the first source protective layer SPL1 and the second source protective layer SPL2. The second source protective layer SPL2 and the first source protective layer SPL1 may be disposed over and below the source sacrificial layer SFL, respectively. In an embodiment, a source protective layer including the first and second source protective layers (SPL1, SPL2) may be disposed on a lower surface and upper surface, respectively, of the source sacrificial layer SFL.

The source sacrificial layer SFL may include a semiconductor material. According to an embodiment, the source sacrificial layer SFL may include polysilicon. The first and second source protective layers SPL1 and SPL2 may include a material having etch selectivity with respect to the first and second source layers SL1 and SL2 and the source sacrificial layer SFL. According to an embodiment, the first and second source protective layers SPL1 and SPL2 may include an oxide.

A preliminary stacked structure Sta may be formed over the preliminary source structure pSOS. The preliminary stacked structure Sta may be formed by alternately stacking the insulating layers IL and first sacrificial layers FL1. The insulating layers IL may include the lowermost insulating layer IL that is disposed at the lowermost level of the preliminary stacked structure Sta and the lowermost insulating layer IL may be formed over the preliminary source structure pSOS. The first sacrificial layers FL1 and the insulating layers IL except for the lowermost insulating layer IL may be alternately stacked over the lowermost insulating layer IL. The first sacrificial layers FL1 may include a different material from the insulating layers IL. According to an embodiment, the first sacrificial layers FL1 may include a material having different etch selectivity from a material included in the insulating layers IL. According to an embodiment, the first sacrificial layers FL1 may include a nitride and the insulating layers IL may include an oxide.

Figure 2B:
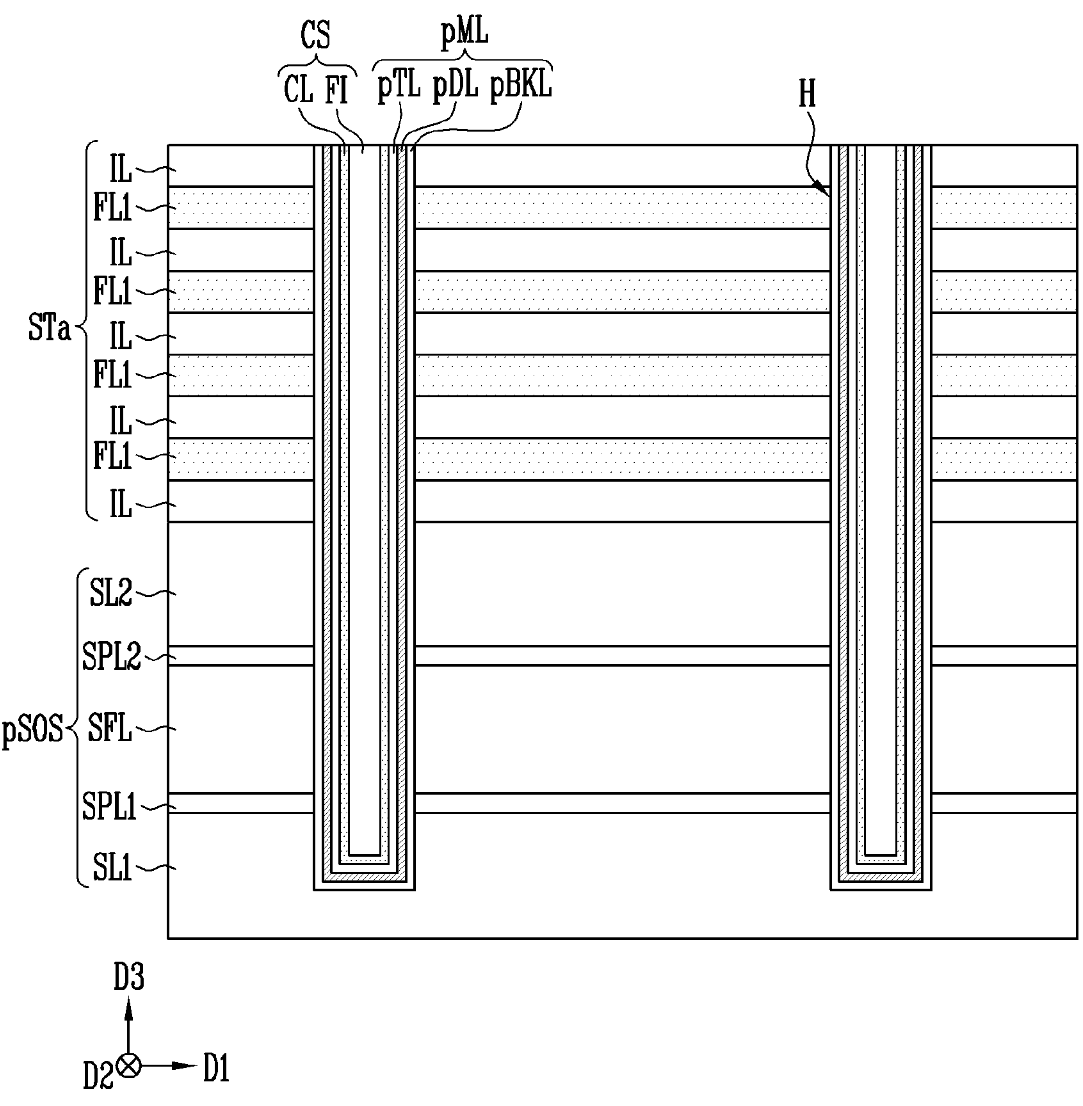

Referring to FIG. 2B, the channel structures CS and preliminary memory layers pML may be formed. The channel structures CS may pass through the preliminary stacked structure Sta, the second source layer SL2, the second source protective layer SPL2, the source sacrificial layer SFL, and the first source protective layer SPL1. The channel structures CS may extend in the third direction D3. The lowermost part of each of the channel structures CS may be disposed in the first source layer SL1. The preliminary memory layer pML may surround the channel structure CS. The preliminary memory layer pML may pass through the preliminary stacked structure Sta, the second source layer SL2, the second source protective layer SPL2, the source sacrificial layer SFL, and the first source protective layer SPL1. The preliminary memory layer pML may extend in the third direction D3. The lowermost part of each of the preliminary memory layers pML may be disposed in the first source layer SL1.

Each of the channel structures CS may include the channel layer CL and the filling layer FI in the channel layer CL. The preliminary memory layer pML may include a preliminary tunnel insulating layer pTL that surrounds each of the channel structures CS, a preliminary data storage layer pDL that surrounds the preliminary tunnel insulating layer pTL, and a preliminary blocking layer pBKL that surrounds the preliminary data storage layer pDL.

Forming the channel structures CS and the preliminary memory layers pML may include forming holes H that pass through the preliminary stacked structure Sta, the second source layer SL2, the second source protective layer SPL2, the source sacrificial layer SFL, and the first source protective layer SPL1 and sequentially forming the preliminary blocking layer pBKL, the preliminary data storage layer pDL, the preliminary tunnel insulating layer pTL, the channel layer CL, and the filling layer FI in each of the holes H.

The preliminary memory layer pML may include the preliminary blocking layer pBKL, the preliminary data storage layer pDL on the preliminary blocking layer pBKL, and the preliminary tunnel insulating layer pTL on the preliminary data storage layer pDL. The preliminary tunnel insulating layer pTL may include a material allowing charge tunneling. The preliminary data storage layer pDL may include a material in which charges may be trapped. The preliminary blocking layer pBKL may include a material capable of blocking movement of charges.

The channel layer CL and the filling layer FI may be disposed in a central region of each of the holes H that is opened through the preliminary memory layer pML and may form the channel structure CS.

Figure 2C:
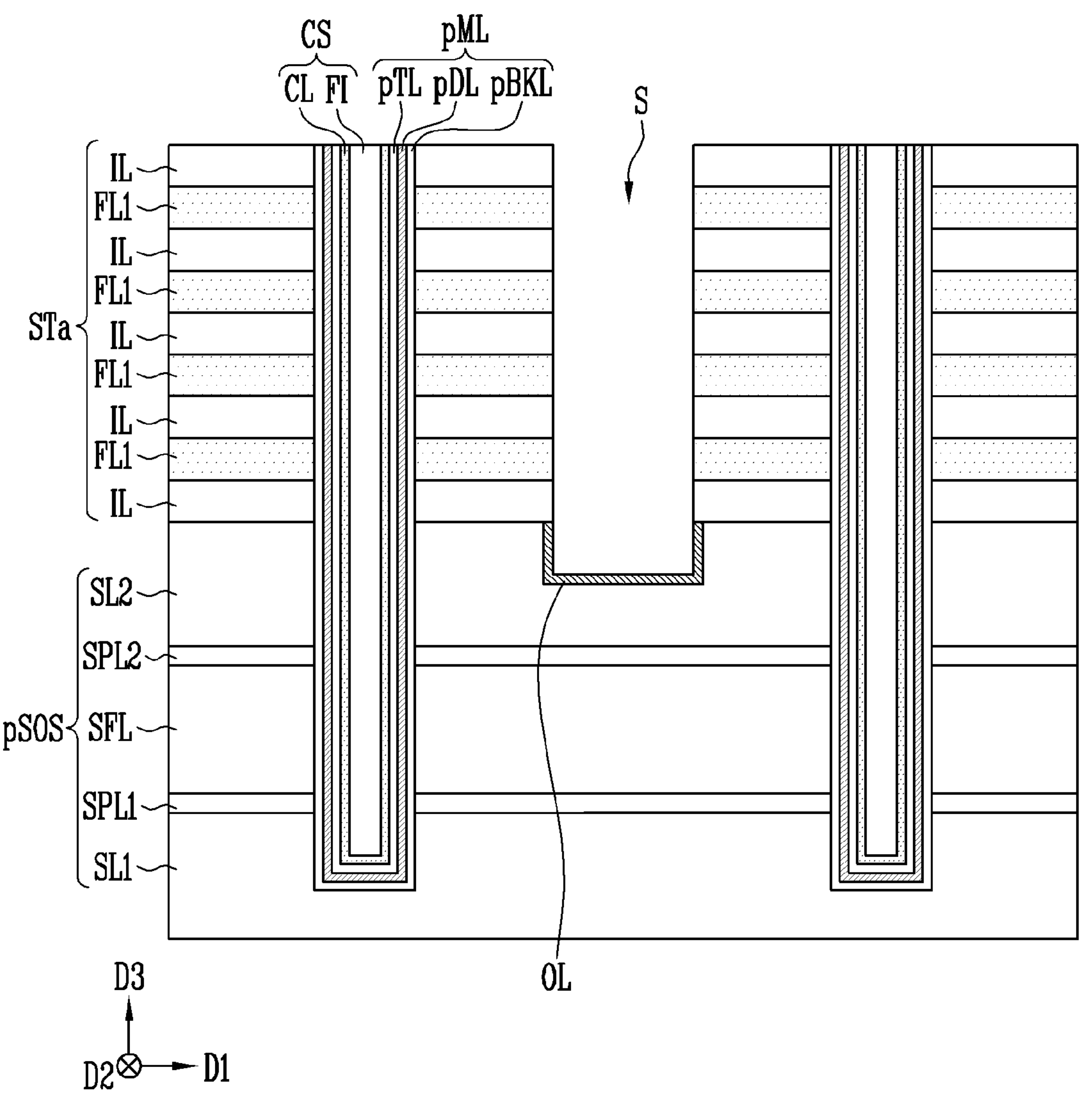

Referring to FIG. 2C, the slit S passing through the preliminary stacked structure Sta may be formed. The slit S may extend in the second direction D2 and the third direction D3. The slit S may be disposed between the channel structures CS. The slit S may expose the insulating layers IL, the first sacrificial layers FL1, and the second source layer SL2. According to an embodiment, the lowermost part of the slit S may be disposed in the second source layer SL2. According to an embodiment, the second source layer SL2 may serve as a stop layer when the slit S is formed.

Surface treatment may be performed on the second source layer SL2 that is exposed through the slit S. According to an embodiment, the above-mentioned surface treatment may be an oxidation process and the second source layer SL2 that is exposed through the slit S may be oxidized by the above-mentioned surface treatment. The surface treatment may be performed on a part of the second source layer SL2 that is exposed through the slit S to form the oxide layer OL on a surface of the second source layer SL2. The slit S passing through the preliminary stacked structure Sta and extending into the second source layer SL2 may correspond to the first part S1 of the slit S that is described above with reference to FIG. 1.

Figure 2D:
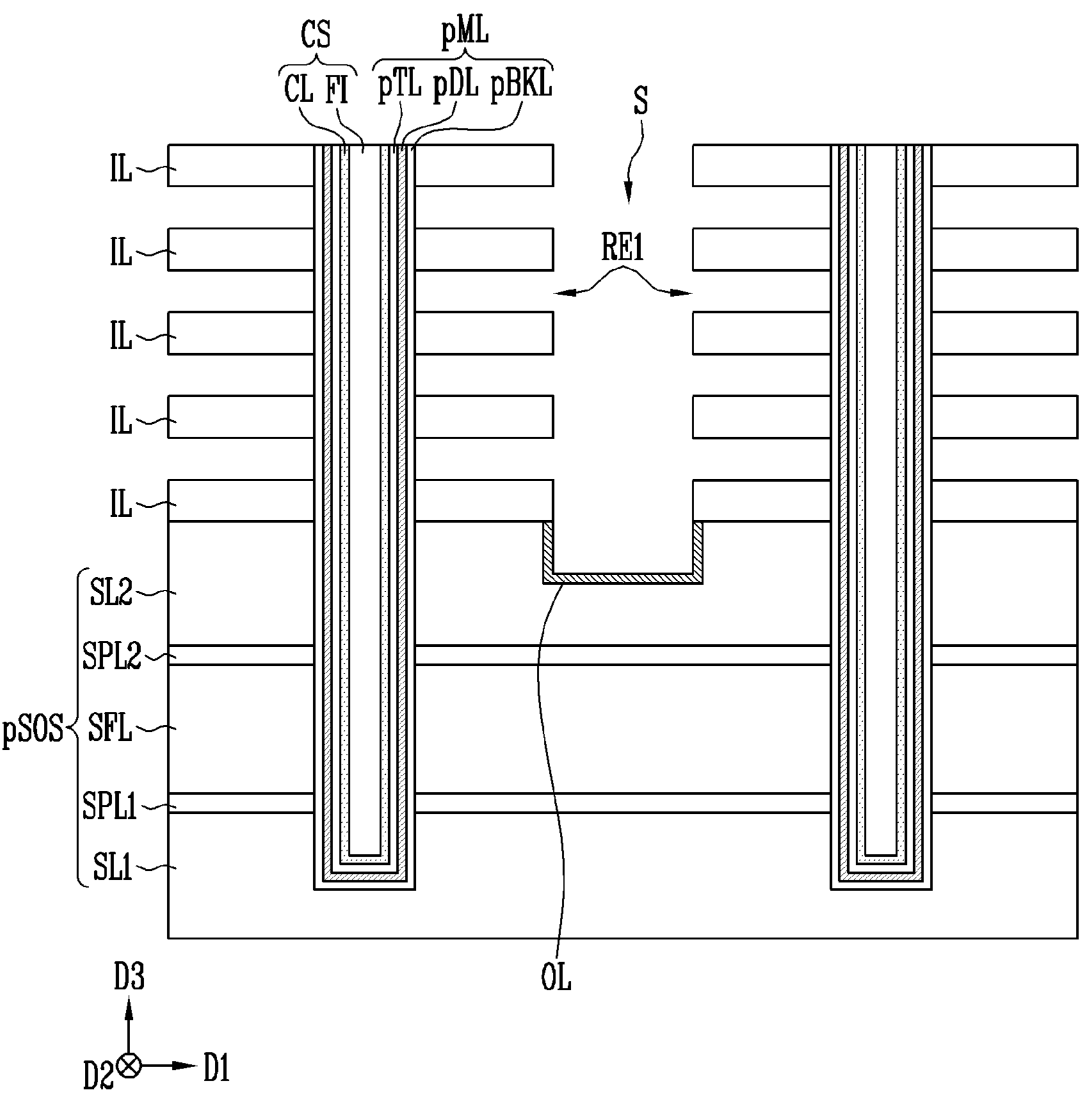

Referring to FIG. 2D, the first sacrificial layers FL1 may be removed. First recess regions RE1 may be formed by removing the first sacrificial layers FL1 that are exposed through the slit S. The first sacrificial layers FL1 including a nitride may be etched using phosphoric acid. In an embodiment, removing the first sacrificial layers FL1 through the slit S defines the first recess regions RE1 between the insulating layers IL.

Figure 2E:
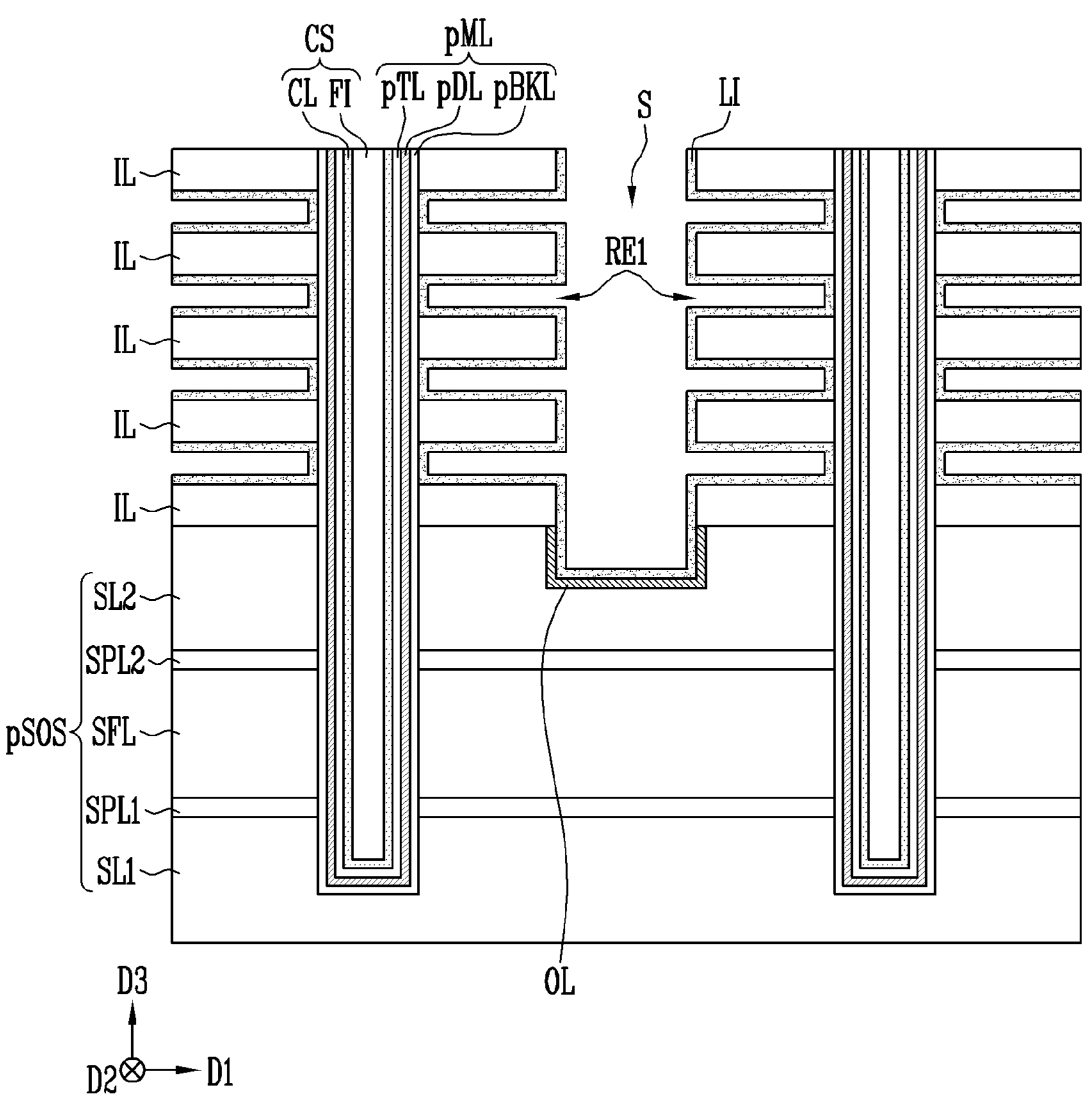

Referring to FIG. 2E, the liner layer LI may be formed along surfaces of the first recess regions RE1 and a surface of the slit S. The liner layer LI may extend along the sidewalls of the insulating layers IL that face the slit S, along upper surfaces and lower surfaces of the insulating layers IL that are exposed through the first recess regions RE1, and along a sidewall of the preliminary memory layer pML that is exposed through the first recess regions RE1. The liner layer LI may extend along a surface of the oxide layer OL. The liner layer LI may include a material capable of protecting the insulating layers IL from hydrogen fluoride (HF) or Buffer Oxide Etchant (BOE) that is used in a subsequent process. The liner layer LI may include a metal-doped oxide. According to an embodiment, the liner layer LI may include at least one of $Al_2O_3$, HfSiOx, HfOx, and $ZrO_2$.

Figure 2F:
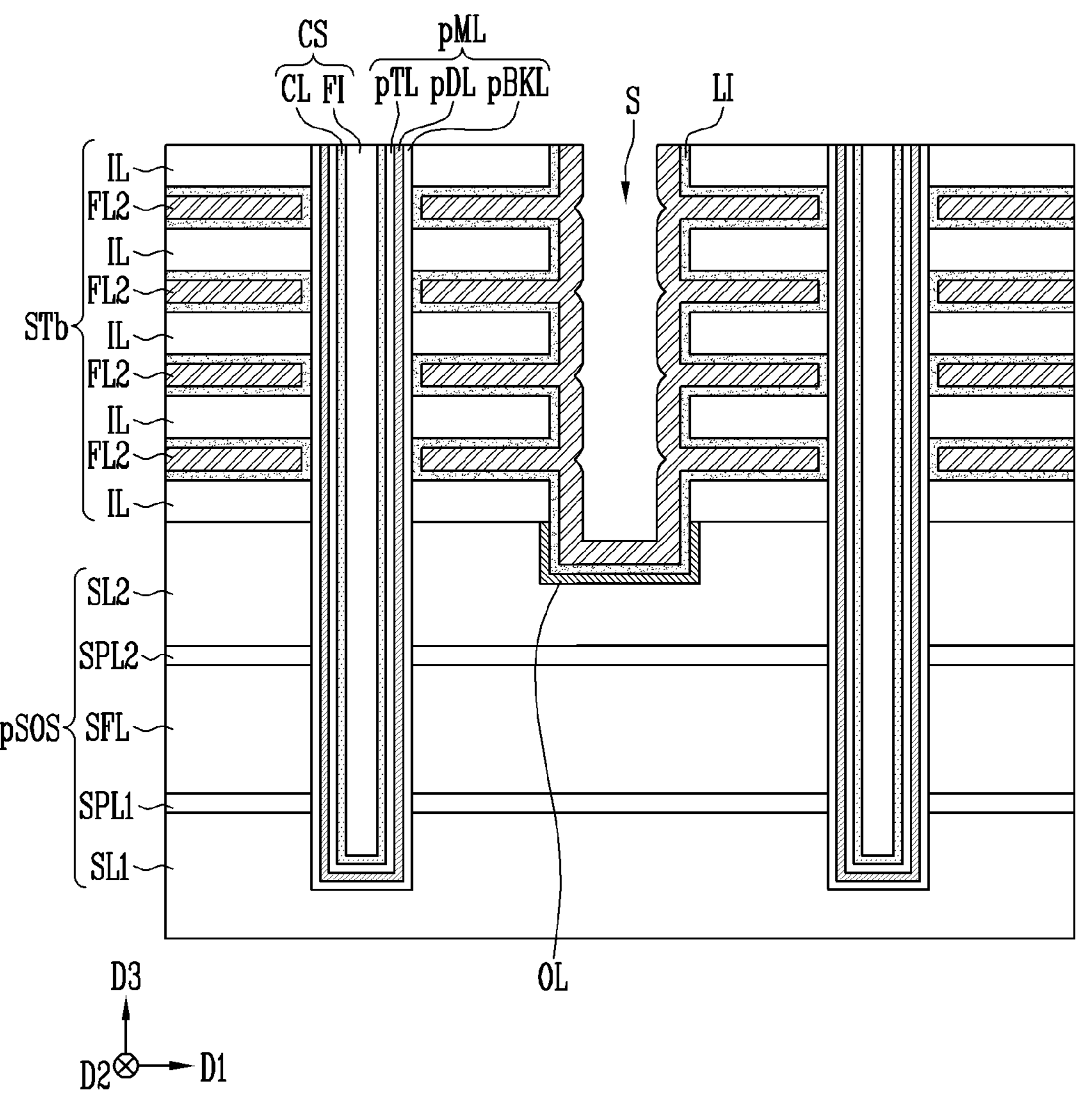

Referring to FIG. 2F, a second sacrificial layer FL2 may be formed in each of the first recess regions RE1. The second sacrificial layer FL2 may extend along the liner layer LI and extend in the slit S.

The second sacrificial layer FL2 may include a material which can be removed more quickly than a material included in the first sacrificial layer FL1 shown in FIG. 2C. According to an embodiment, the second sacrificial layer FL2 may include an oxide.

Figure 2G:
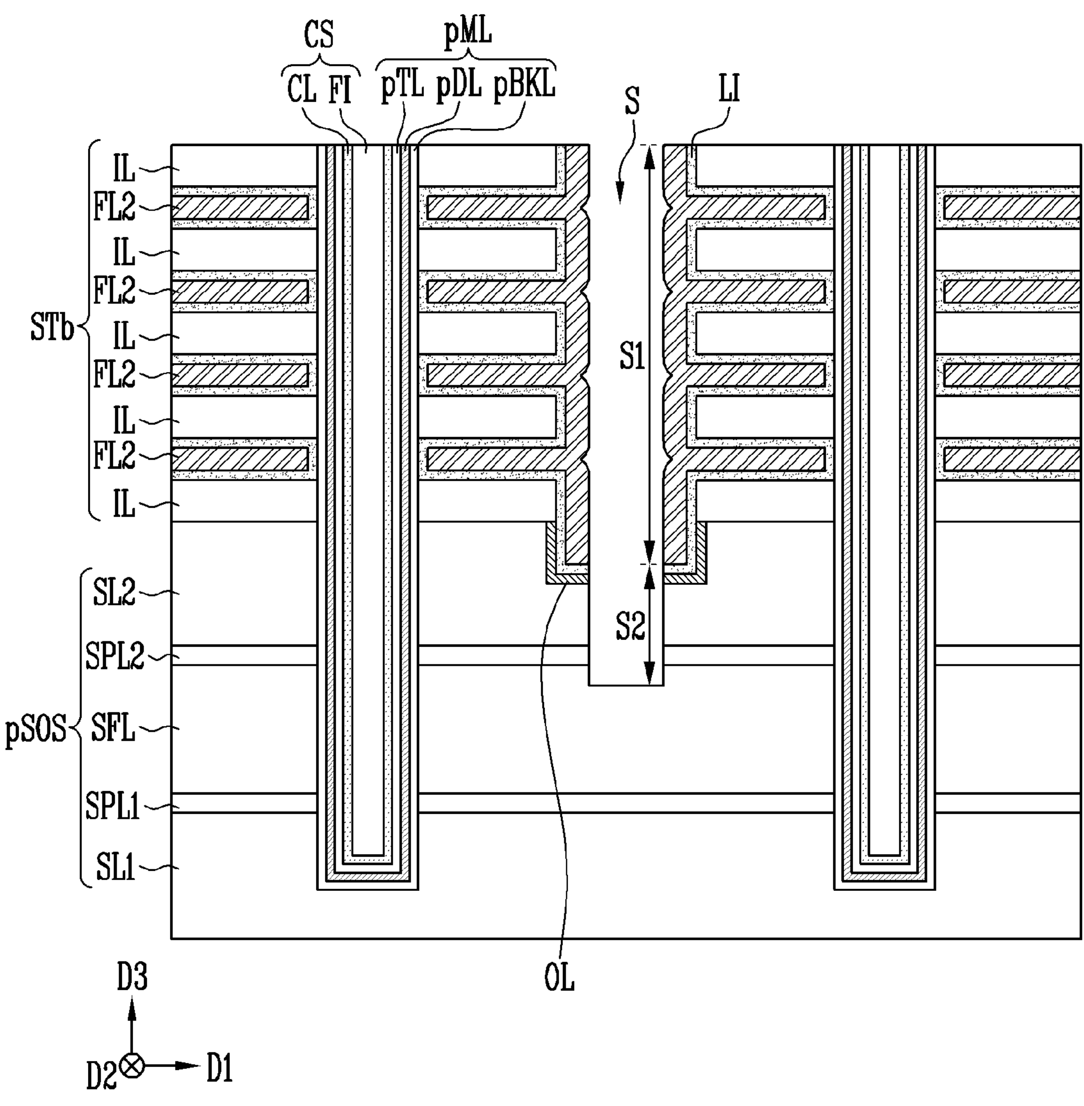

Referring to FIG. 2G, a part of the second sacrificial layer FL2 over the second source layer SL2, a part of the liner layer LI over the second source layer SL2, a part of the oxide layer OL over the second source layer SL2, a part of the second source layer SL2, and a part of the second source protective layer SPL2 may be removed through the slit S. Accordingly, the slit S may be extended to expose the source sacrificial layer SFL. A part of the extended slit S may be the second part S2 of the slit S that is described above with reference to FIG. 1. The second part S2 of the slit S may pass through the second source protective layer SPL2. A part of the second sacrificial layer FL2 that extends along the sidewall of the slit S may serve as an etching barrier when the second part S2 of the slit S is formed. Accordingly, the second part S2 of the slit S may be formed to have the width that is smaller than that of the first part S1 of the slit S that passes through a preliminary stacked structure STb.

The slit S may extend such that the lowermost part of the slit S is disposed in the source sacrificial layer SFL. The second sacrificial layer FL2 may protect the insulating layers IL and the liner layer LI that surrounds the insulating layers IL during an etch back process for extending the slit S.

Figure 2H:
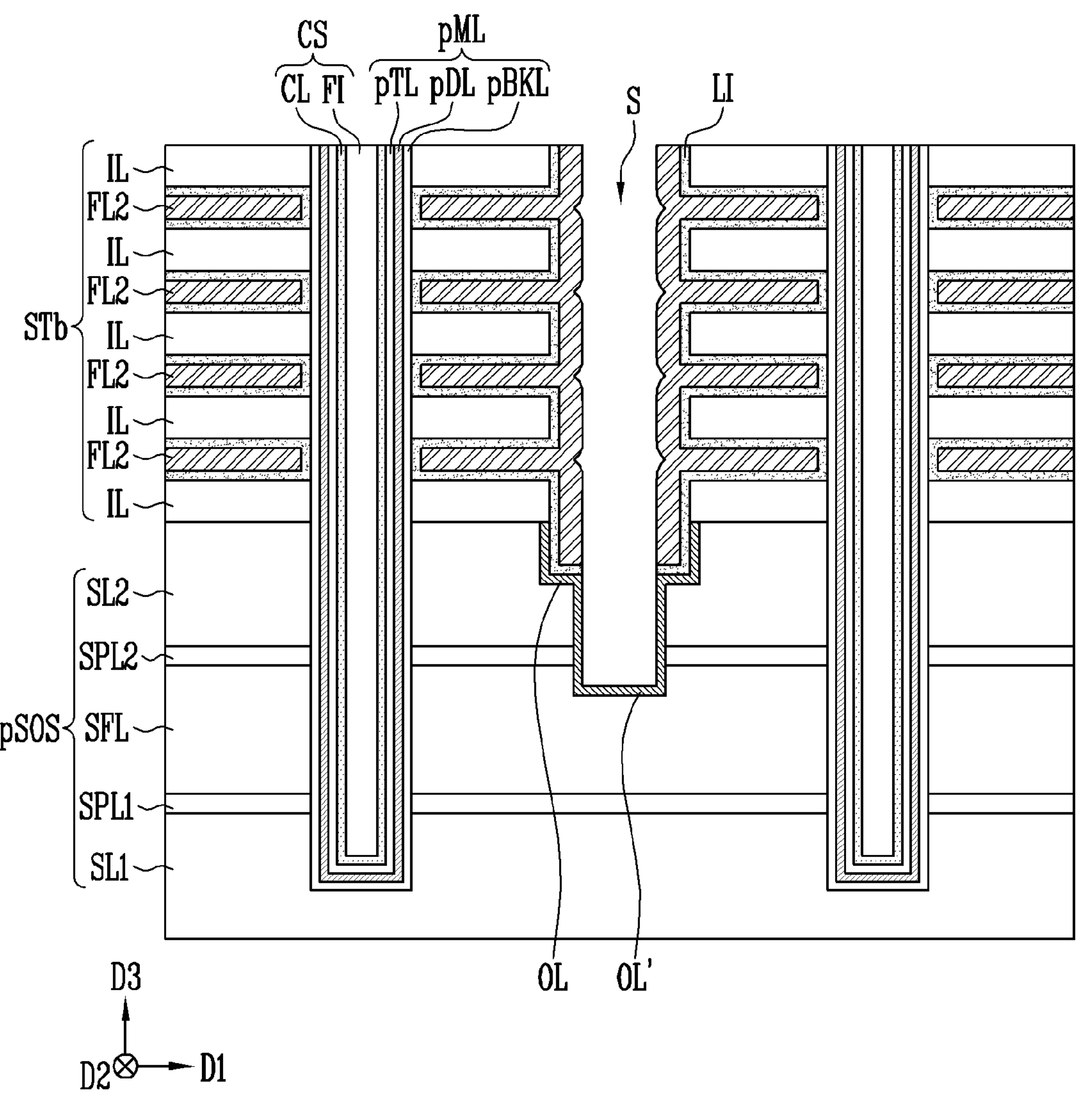

Referring to FIG. 2H, a part of the second source layer SL2 and a part of the source sacrificial layer SFL that are exposed through the extended slit S may be oxidized. Accordingly, an oxide layer OL' may be formed. The oxide layer OL' may extend along a surface of the second source protective layer SPL2.

Figure 2I:
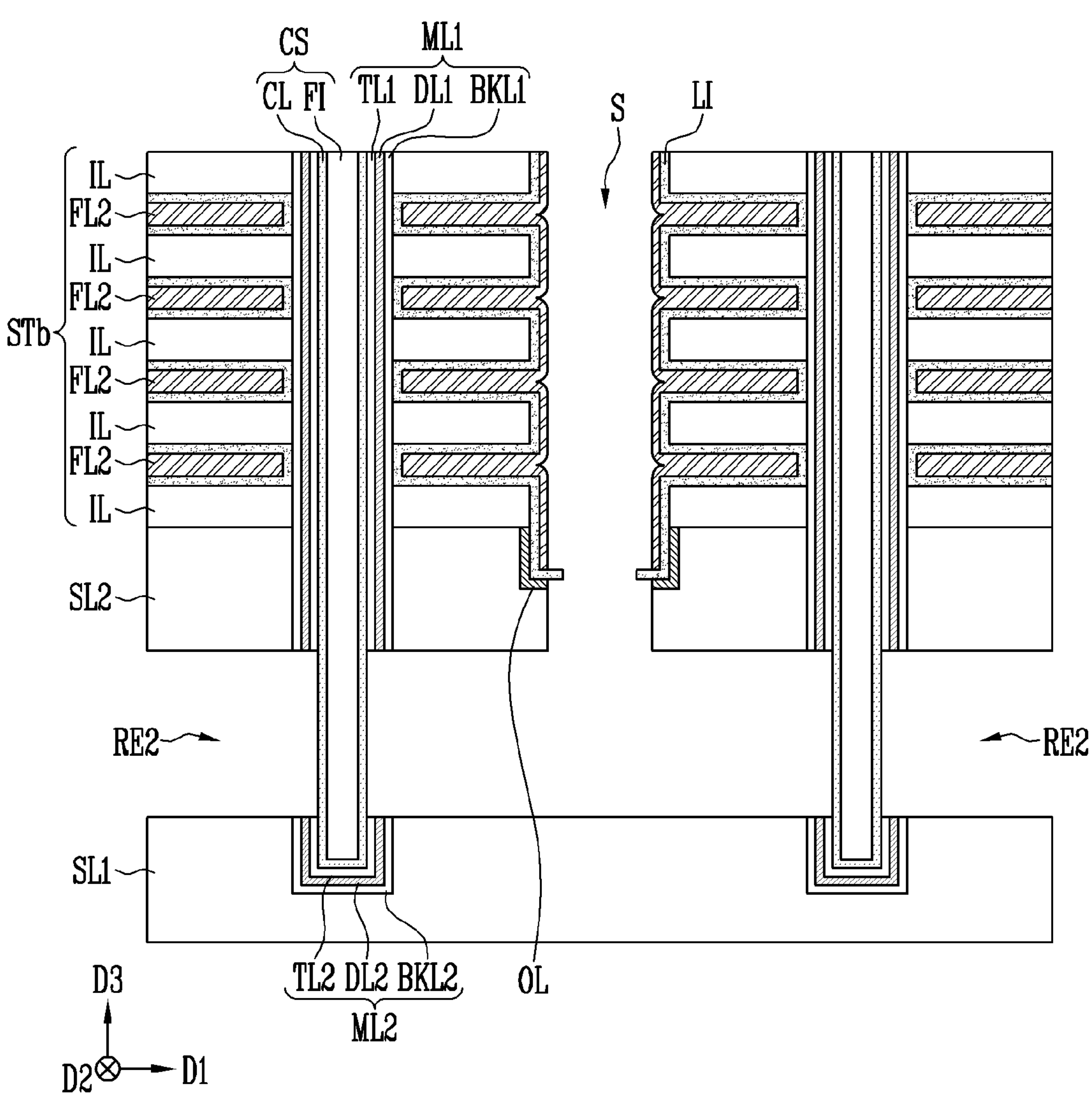

Referring to FIG. 2I, the source sacrificial layer SFL may be removed. Removing the source sacrificial layer SFL may include injecting a material capable of etching the source sacrificial layer SFL through the slit S. The second sacrificial layer FL2 may protect the insulating layers IL and the liner layer LI that surrounds the insulating layers IL when the source sacrificial layer SFL is removed. The oxide layer OL', the first source protective layer SPL1, and the second source protective layer SPL2 shown in FIG. 2H may protect the first source layer SL1 and the second source layer SL2 when the source sacrificial layer SFL is removed. According to an embodiment, the first and second source protective layers SPL1 and SPL2 might not be etched when the source sacrificial layer SFL is removed. In an embodiment, the source protective layer (i.e., the first and second source protective layers SPL1 and SPL2) may be removed after removing the source sacrificial layer SFL.

A second recess region RE2 may be formed by removing the source sacrificial layer SFL. An empty space formed by removing the source sacrificial layer SFL may be defined as the second recess region RE2.

The source sacrificial layer SFL that is a part of the preliminary source structure pSOS shown in FIG. 2H may be removed to expose a part of the preliminary memory layer pML shown in FIG. 2H and an upper surface of the first source protective layer SPL1 and a lower surface of the second source protective layer SPL2 shown in FIG. 2H.

Because the liner layer LI includes a material having higher etch selectivity with respect to the source sacrificial layer SFL than a material included in the second sacrificial layer FL2 and the oxide layer OL, the liner layer LI may scarcely be removed by an etching material that removes the source sacrificial layer SFL and may remain. According to an embodiment, the liner layer LI may remain in a shape that protrudes farther in the first direction D1 than the oxide layer OL. The source sacrificial layer SFL may be removed by a wet etching process.

Subsequently, a part of the preliminary memory layer pML between the first source layer SL1 and the second source layer SL2 shown in FIG. 2H may be removed through the second recess region RE2, thereby exposing the channel layer CL of the channel structure CS. Accordingly, the preliminary memory layer pML may be divided into the first memory layer ML1 and the second memory layer ML2. In an embodiment, the first memory layer ML1 may be over the second recess region RE2 and the second memory layer ML2 may be under the second recess region RE2. The oxide layer OL', the first source protective layer SPL1, and the second source protective layer SPL2 shown in FIG. 2H may be removed when the part of the preliminary memory layer pML shown in FIG. 2H is removed.

Figure 2J:
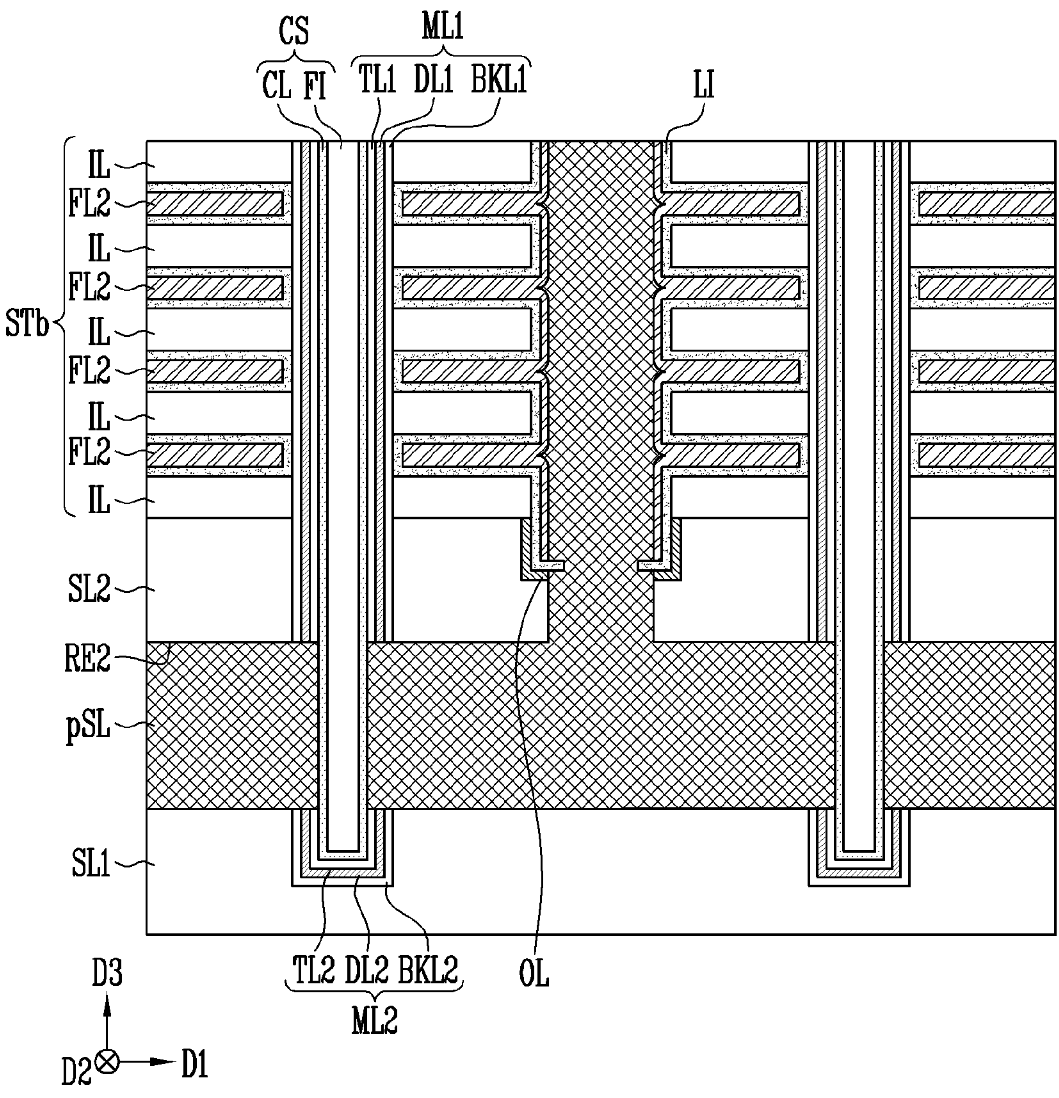

Referring to FIG. 2J, a preliminary source layer pSL may be formed in the second recess region RE2 and the slit S. The preliminary source layer pSL may cover the top surface of the first source layer SL1 and the bottom surface of the second source layer SL2. The preliminary source layer pSL may contact the channel layer CL of the channel structure CS. The preliminary source layer pSL may include a semiconductor material. According to an embodiment, the preliminary source layer pSL may include polysilicon. At least one of an n-type impurity or a p-type impurity may be doped into the preliminary source layer pSL.

Figure 2K:
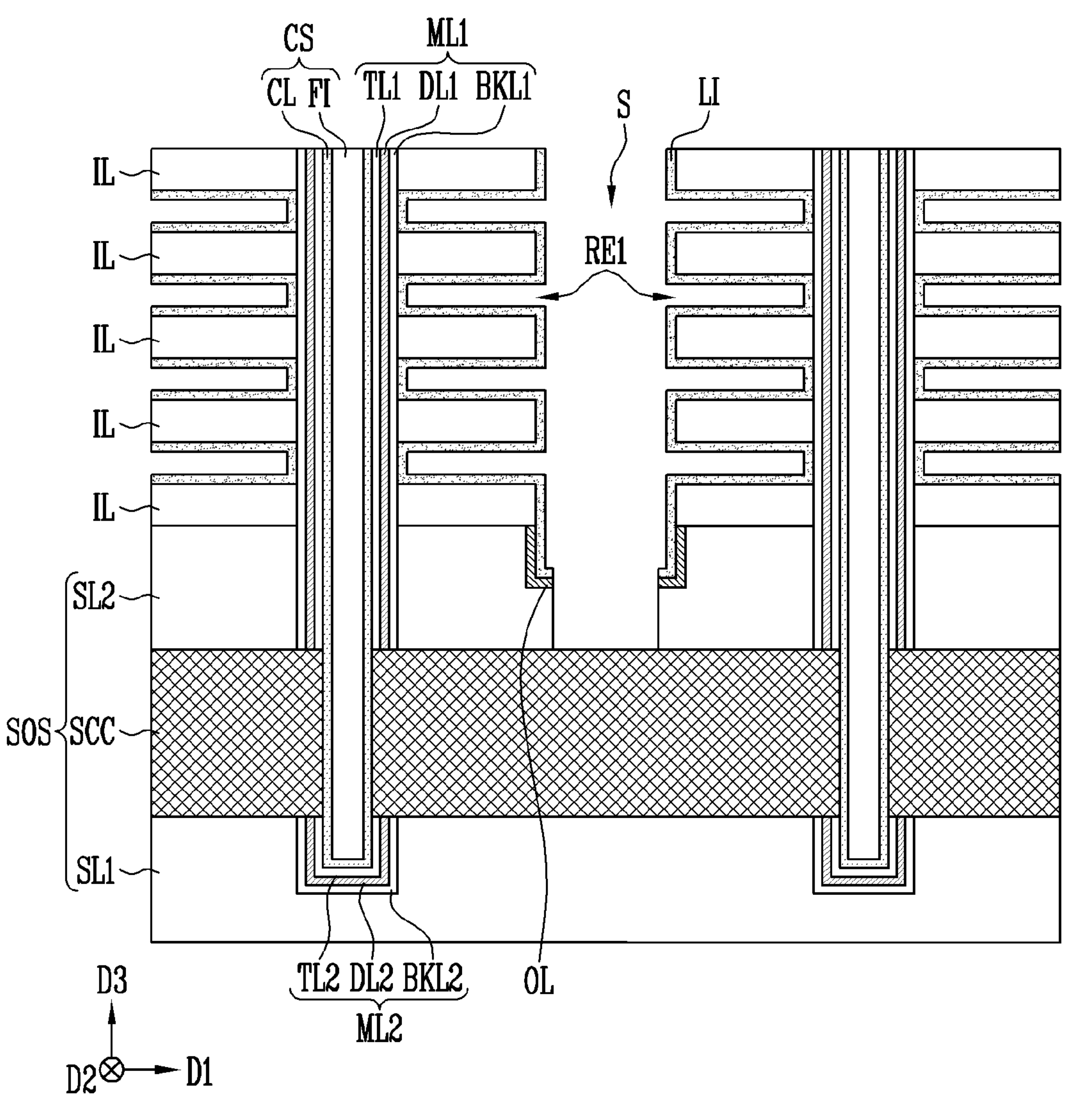

Referring to FIG. 2K, a part of the preliminary source layer pSL shown in FIG. 2J may be removed. According to an embodiment, a part of the preliminary source layer pSL in the slit S may be removed. A part of the preliminary source layer pSL that remains in the second recess region RE2 may be defined as the source channel coupling layer SCC. A protrusion of the liner layer LI may be removed when the part of the preliminary source layer pSL is removed.

As described above, the source structure SOS including the first source layer SL1, the source channel coupling layer SCC, and the second source layer SL2 may be formed by replacing the source sacrificial layer SFL by the source channel coupling layer SCC. The source structure SOS may be connected to the channel layer CL through the source channel coupling layer SCC. The slit S may be opened over the source structure SOS.

A speed of a process of removing the second sacrificial layer FL2 using HF and BOE may be higher than a speed of a process of removing the first sacrificial layers FL1 using phosphoric acid which is described above with reference to FIG. 2D. According to an embodiment, the source structure SOS might not be exposed to an etching process using phosphoric acid that is performed for a relatively long time and may be exposed to an etching process using HF and BOE that is performed for a relatively short time. Accordingly, according to an embodiment, a phenomenon in which the source structure SOS is damaged by an effect of an etching process of a sacrificial layer may be mitigated.

The liner layer LI may scarcely be etched and may remain when the liner layer LI is exposed to HF and BOE. Accordingly, the liner layer LI may protect the insulating layers IL including an oxide when the etching process of the second sacrificial layer FL2 using HF and BOE is performed.

Figure 2L:
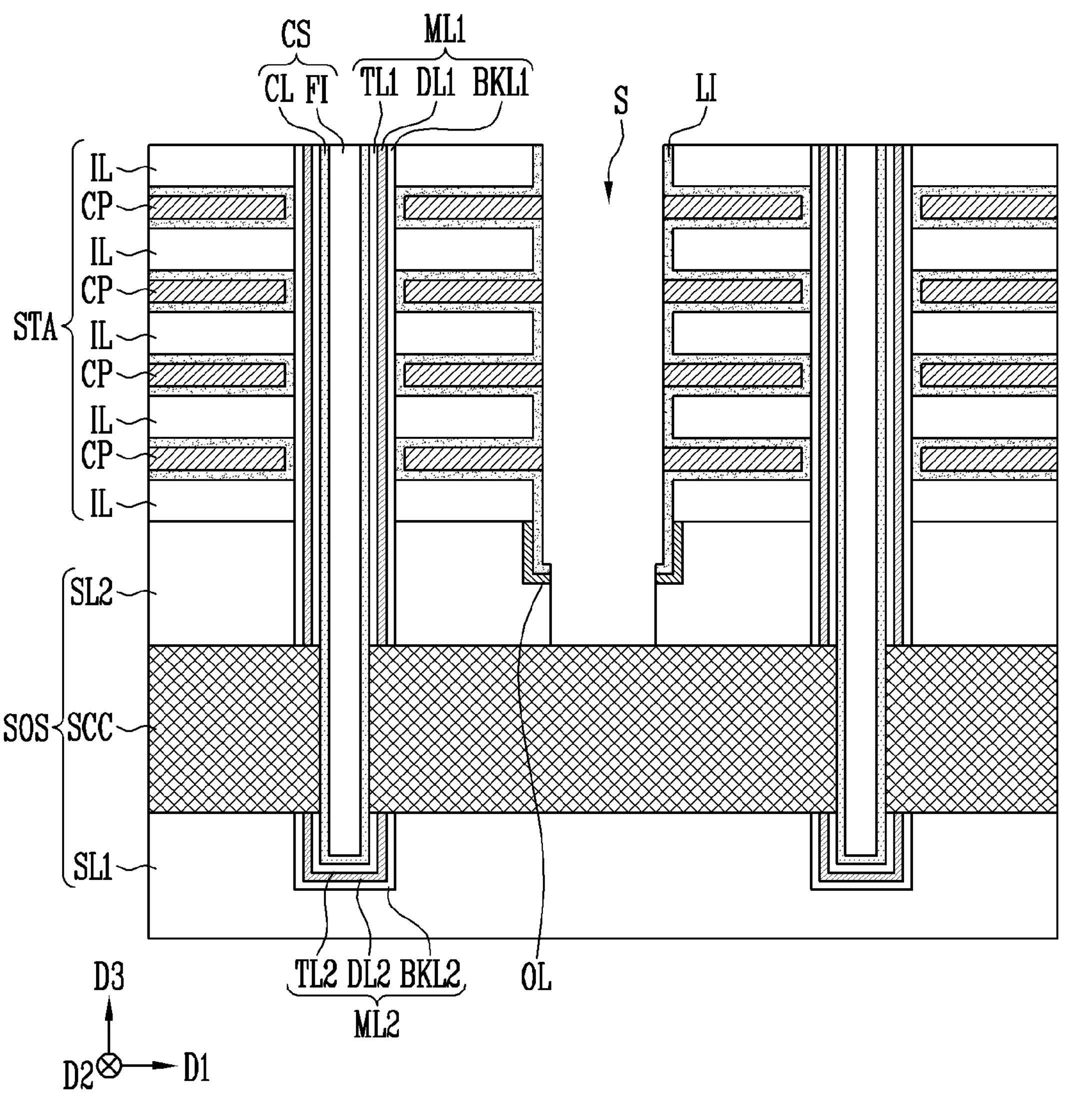

Referring to FIG. 2L, the conductive layers CP may be formed in the opened first recess regions. As described above, the second sacrificial layer FL2 in each of the first recess regions may be replaced by the conductive layer CP through a series of processes. The processes of replacing the second sacrificial layers FL2 by the conductive layers CP may be performed after the source channel coupling layer SCC is formed. Accordingly, in an embodiment, a defect that fume is generated in the conductive layers CP due to heat produced when the source channel coupling layer SCC is formed may fundamentally be prevented or mitigated. In an embodiment, the liner layer LI may remain to serve as a blocking insulating layer.

Figure 3:
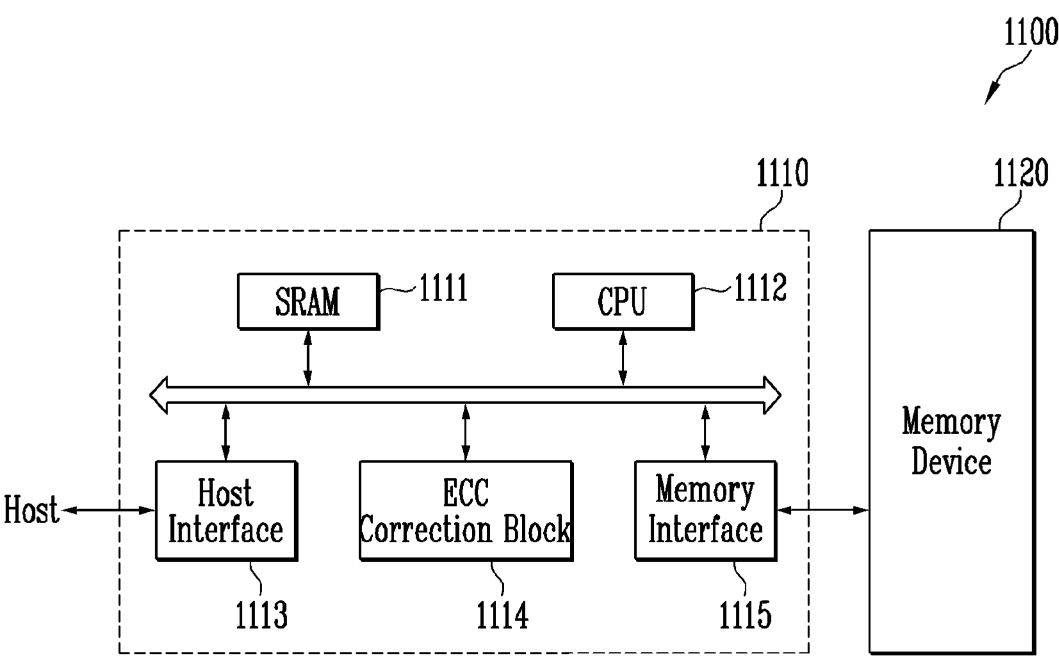
FIG. 3 is a block diagram illustrating a configuration of a memory system according to an embodiment.

FIG. 3 is a block diagram illustrating a configuration of a memory system 1100 according to an embodiment.

Referring to FIG. 3, the memory system 1100 may include a memory device 1120 and a memory controller 1110.

The memory device 1120 may be a multi-chip package including a plurality of flash memory chips.

The memory controller 1110 may be configured to control the memory device 1120 and may include Static Random Access Memory (SRAM) 1111, a Central Processing Unit (CPU) 1112, a host interface 1113, an ECC correction block 1114, and a memory interface 1115. The SRAM 1111 may serve as operating memory of the CPU 1112, the CPU 1112 may perform general control operations for data exchange of the memory controller 1110, and the host interface 1113 may include a data exchange protocol of a host accessing the memory system 1100. The ECC correction block 1114 may detect and correct an error included in data read from the memory device 1120. The memory interface 1115 may interface with the memory device 1120. The memory controller 1110 may further include Read Only Memory (ROM) for storing code data for interfacing with the host.

The memory system 1100 having the above-described configuration may be a Solid-State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols such as a Universal Serial Bus (USB), a MultiMedia Card (MMC), Peripheral Component Interconnect Express (PCI-e), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 4:
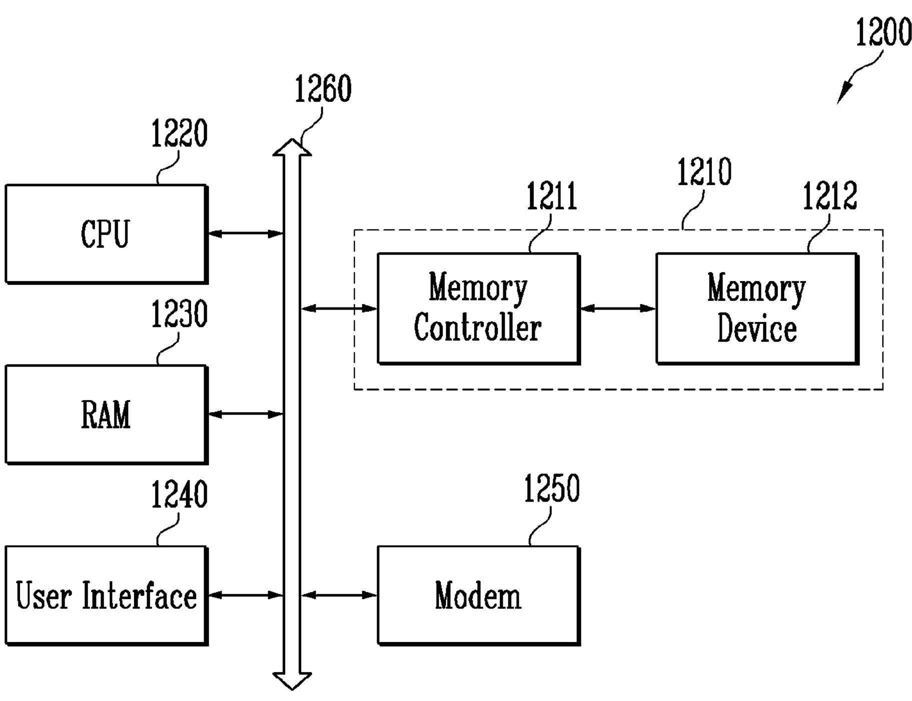
FIG. 4 is a block diagram illustrating a configuration of a computing system according to an embodiment.

FIG. 4 is a block diagram illustrating a configuration of a computing system 1200 according to an embodiment.

Referring to FIG. 4, the computing system 1200 may include a CPU 1220, Random Access Memory (RAM) 1230, a user interface 1240, a modem 1250, and a memory system 1210 that are electrically coupled to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211.

The memory controller 1211 may be configured in the same manner as the memory controller 1110 described above with reference to FIG. 3.

According to embodiments of the present disclosure, a first sacrificial layer of a preliminary stacked structure may be replaced by a second sacrificial layer before a process of replacing a source sacrificial layer by a source channel coupling layer is performed and the second sacrificial layer of the preliminary stacked structure may be replaced by a conductive layer after the process of replacing the source sacrificial layer by the source channel coupling layer is performed. Accordingly, in an embodiment, a defect in a process of manufacturing a semiconductor memory device may be mitigated and safety of the manufacturing process may be improved.

What is claimed is:

1. A method of manufacturing a semiconductor memory device, the method comprising:

forming a preliminary source structure including a source sacrificial layer;

forming a preliminary stacked structure including insulating layers and first sacrificial layers alternately stacked with each other over the preliminary source structure;

forming a slit passing through the preliminary stacked structure;

removing the first sacrificial layers through the slit to define first recess regions between the insulating layers;

forming a second sacrificial layer in each of the first recess regions;

removing the source sacrificial layer through the slit to define a second recess region after forming the second sacrificial layer; and forming a source channel coupling layer in the second recess region.

2. The method of claim 1, further comprising forming a liner layer along the first recess regions after the first recess regions are formed.

3. The method of claim 2, wherein the liner layer includes a metal-doped oxide.

4. The method of claim 1, wherein the first sacrificial layers include a nitride, and wherein the second sacrificial layer includes an oxide.

5. The method of claim 1, further comprising replacing the second sacrificial layer with a conductive layer.

6. The method of claim 5, wherein replacing the second sacrificial layer by the conductive layer is performed after forming the source channel coupling layer.

7. The method of claim 1, wherein removing the source sacrificial layer includes a wet etching process.

8. The method of claim 1, wherein the preliminary source structure includes a source protective layer disposed on each of an upper surface and a lower surface of the source sacrificial layer.

9. The method of claim 8, further comprising removing the source protective layer after removing the source sacrificial layer.

10. The method of claim 1, further comprising:

extending the slit into the preliminary source structure after forming the second sacrificial layer; and forming an oxide layer on a surface of the preliminary source structure that is exposed through the slit.

11. The method of claim 1, wherein the preliminary source structure further includes a first source layer under the source sacrificial layer and a second source layer over the source sacrificial layer.

12. The method of claim 11, further comprising:

forming a hole that passes through the second source layer and the source sacrificial layer and extends into the first source layer;

forming a memory layer in the hole; and forming a channel structure in a central region of the memory layer.

13. The method of claim 12, further comprising removing a part of the memory layer through the second recess region such that the memory layer is divided into a first memory layer over the second recess region and a second memory layer under the second recess region.

14. The method of claim 13, wherein the source channel coupling layer passes between the first and second memory layers and is directly coupled to the channel structure.

* * * * *